(12) United States Patent
Hu et al.

(10) Patent No.: US 9,936,577 B1
(45) Date of Patent: Apr. 3, 2018

(54) DUAL-CHANNEL FLEXIBLE CIRCUIT BRIDGE CONNECTOR AND DUAL GRAPHICS CARD SYSTEM USING THE SAME

(71) Applicant: WIESON TECHNOLOGIES CO., LTD., New Taipei (TW)

(72) Inventors: Qiang-Long Hu, New Taipei (TW); Wen-Sheng Liu, New Taipei (TW)

(73) Assignee: WIESON TECHNOLOGIES CO., LTD., New Taipei (TW)

( * ) Notice: Subject to any disclaimer, the term of this patent is extended or adjusted under 35 U.S.C. 154(b) by 0 days.

(21) Appl. No.: 15/703,257

(22) Filed: Sep. 13, 2017

(51) Int. Cl.
| | |
|---|---|
| *H05K 1/11* | (2006.01) |
| *H01R 12/62* | (2011.01) |
| *G06F 13/40* | (2006.01) |
| *H01R 12/59* | (2011.01) |
| *H01R 43/20* | (2006.01) |
| *H05K 3/36* | (2006.01) |
| *H05K 1/14* | (2006.01) |
| *H05K 1/02* | (2006.01) |

(52) U.S. Cl.
CPC ............. *H05K 1/11* (2013.01); *G06F 13/409* (2013.01); *H01R 12/592* (2013.01); *H01R 12/62* (2013.01); *H01R 43/20* (2013.01); *H05K 1/147* (2013.01); *H05K 3/363* (2013.01); *H05K 1/0284* (2013.01); *H05K 1/118* (2013.01); *H05K 2201/0999* (2013.01); *H05K 2201/10295* (2013.01)

(58) Field of Classification Search
CPC .......... H05K 1/11; H05K 1/111; H05K 1/112; H05K 1/113; H05K 1/114; H05K 1/117; H05K 1/118; H05K 1/119
See application file for complete search history.

(56) References Cited

U.S. PATENT DOCUMENTS

| | | | | |
|---|---|---|---|---|
| 5,888,102 | A * | 3/1999 | Strickland .............. | H05K 3/301 361/809 |
| 2015/0014040 | A1* | 1/2015 | Ahn ......................... | H01G 4/30 174/260 |

* cited by examiner

*Primary Examiner* — Jeremy C Norris
(74) *Attorney, Agent, or Firm* — Muncy, Geissler, Olds & Lowe, P.C.

(57) ABSTRACT

The present disclosure illustrates a dual-channel flexible circuit bridge connector and a dual graphics card system using the same. The dual-channel flexible circuit bridge connector includes a dual-channel flexible circuit board, a first connection interface and a second connection interface. The dual-channel flexible circuit board includes, in a sequential order, a first insulating layer, a first circuit layer, a second insulating layer, a ground layer, a third insulating layer, a second circuit layer and a fourth insulating layer. The first connection interface and the second connection interface can be used to link two graphics cards spaced apart by a non-fixed distance, thereby forming a bridging status. Therefore, the dual graphics card system can manipulate two graphics cards to perform parallel computation, so as to achieve better efficiency in computing process and graphics display.

8 Claims, 8 Drawing Sheets

DUAL-CHANNEL FLEXIBLE CIRCUIT BRIDGE CONNECTOR AND DUAL GRAPHICS CARD SYSTEM USING THE SAME

BACKGROUND OF THE INVENTION

1. Field of the Invention

The present disclosure relates to an dual-channel flexible circuit bridge connector and a dual graphics card system using the same, more particularly to a first connection interface and a second connection interface disposed on two sides of a dual-channel flexible circuit board are used to link two graphics cards spaced apart by various distances, so as to form a bridging status. Furthermore, the dual graphics card system using the dual-channel flexible circuit bridge connector can have higher efficiency in computing process and graphics display.

2. Description of the Related Art

With rapid development in the electronic technology, a computer or a server has higher and higher computing speed and efficiency. The computer or the server includes a motherboard, and a central processor and a memory disposed on the motherboard to serve as information processing center; and, the computer or the server is also connected with peripheral devices (such as a screen or a modem) for display, data transmission and command control. Therefore, there are various interface cards inserted in sockets on the motherboard, so that the peripheral devices can perform data transmission with the computer or the server through the interface cards, and the computer or the server can be linked with more peripheral devices for function expansion.

Furthermore, with consumers' constant pursuit of high image quality, the display interface is required to define higher and higher resolution and efficiency. For this reason, manufacturers develop Scalable Link Interface (SLI) technology for bridging two graphics cards for single output in use. A motherboard supportable to the SLI technology is provided with two sockets disposed in parallel, and the two graphics cards are respectively inserted into the two sockets. Each graphics card includes a connector disposed on a top thereof, and a plurality of connecting members of a dual-graphics card bridge connector are respectively connected to the connectors of the two graphics cards to form a bridging status, so that the motherboard can manipulate the graphics processing units on the two graphics cards to perform parallel computation for 3D graphics, thereby achieving the best graphic display efficiency. With progress of integrated circuit technology, the hardware architecture of two graphics cards is declining gradually; however, when virtual reality and augmented reality technologies become more popular, the technology of bridging two graphics cards is taken seriously again. This technology is mainly applied in the interface card with in Peripheral Component Interconnect Express (PCI-Express) standard, which is a mainstream standard currently in computer field, to solve problems that the bus transmission architecture of conventional expansion interface is inadequate and has not enough bandwidth. By using the SLI technology, two graphics cards can sufficiently achieve high-speed graphic display performance.

Commercially available bridge connectors for dual graphics cards can be classified into single-channel flexible bridge connector, single-channel board bridge connector, and dual-channel board bridge connector. The conventional single-channel flexible bridge connector uses a flexible board which includes an insulating layer, and two signal layers which are respectively disposed on upper and lower sides of the insulating layer. Because of limitation in flexible substrate and circuit layout used in manufacturing process of flexible board and physical limitation in structure, the dual-layer flexible board is unable to meet the requirement in high transmission rate and high efficiency. Furthermore, during the high-speed transmission, high frequency signal reflection and skin effect are occurred easily, and the multilayer flexible board structure can use a power layer and a ground layer, which both are disposed at middle section of the flexible board, so as to improve electrical characteristics (such as characteristic impedance). However, with increasing of the high frequency signal transmission channel and working bandwidth of the multilayer flexible board, the multilayer flexible board may have higher thickness and insufficient flexibility, and not easily meet the requirement in characteristic impedance, and this is the reason that the conventional single-channel flexible bridge connector is mainly provided with two-layer flexible board for low data rate application, and is unable to support signal transmission between high-end graphics cards bridged with each other.

In recent years, circuit board manufacturing process technology is fully developed to manufacture a circuit board with high performance, high density and multilayer interconnection structure, and this kind of circuit board can be applied in the single-channel board bridge connector or dual-channel board bridge connector; besides, in order to meet the requirement for high frequency signal transmission and electrical characteristics and reduce skin effect and EMI between adjacent circuit layers, more power layers and ground layers must be added into the circuit board. The number of layers of the circuit board indicates the number of individual circuit layers and is usually an even-number, for example, the circuit board usually has two layers, four layers or eight layers; however, the circuit board having more layers usually has higher thickness and poor flexibility, so the circuit board cannot be bent easily. Various motherboard manufacturers or graphics card manufacturers usually have different design solutions, and it indicates that a bridging distance between two graphics cards cannot be standardized, so it is hard for one conventional dual-channel board bridge connector to bridge two graphics cards spaced apart by various distances, that is, the conventional dual-channel board bridge connector cannot meet the user's requirement in upgrade and expansion.

SUMMARY OF THE INVENTION

An objective of the present disclosure is to provide a dual-channel flexible circuit bridge connector and a dual graphics card system using the same to solve the problems that the data rate of the single-channel flexible bridge connector is too slow and the dual-channel board bridge cannot bridge two graphics cards spaced apart by any distance.

According to an embodiment, the present disclosure provides a dual-channel flexible circuit bridge connector a dual-channel flexible circuit board, a first connection interface and a second connection interface disposed on two sides of the same surface of the dual-channel flexible circuit board. The first connection interface includes at least two first bridges which each includes a first socket and a first terminal set inserted through the first socket. The second connection interface includes at least two second bridges which each includes a second socket and a second terminal set inserted through the second socket. The at least two first bridges and the at least two second bridges can be respectively connected on the connectors of the two graphics cards, thereby linking the two graphics cards spaced apart by non-fixed distance in a bridging status. As a result, the dual graphics card system can manipulate two graphics cards to perform parallel computation, so as to achieve better efficiency in computing process and graphics display.

BRIEF DESCRIPTION OF THE DRAWINGS

The structure, operating principle and effects of the present disclosure will be described in detail by way of various embodiments which are illustrated in the accompanying drawings.

DETAILED DESCRIPTION OF THE PREFERRED EMBODIMENTS

Figure 1:
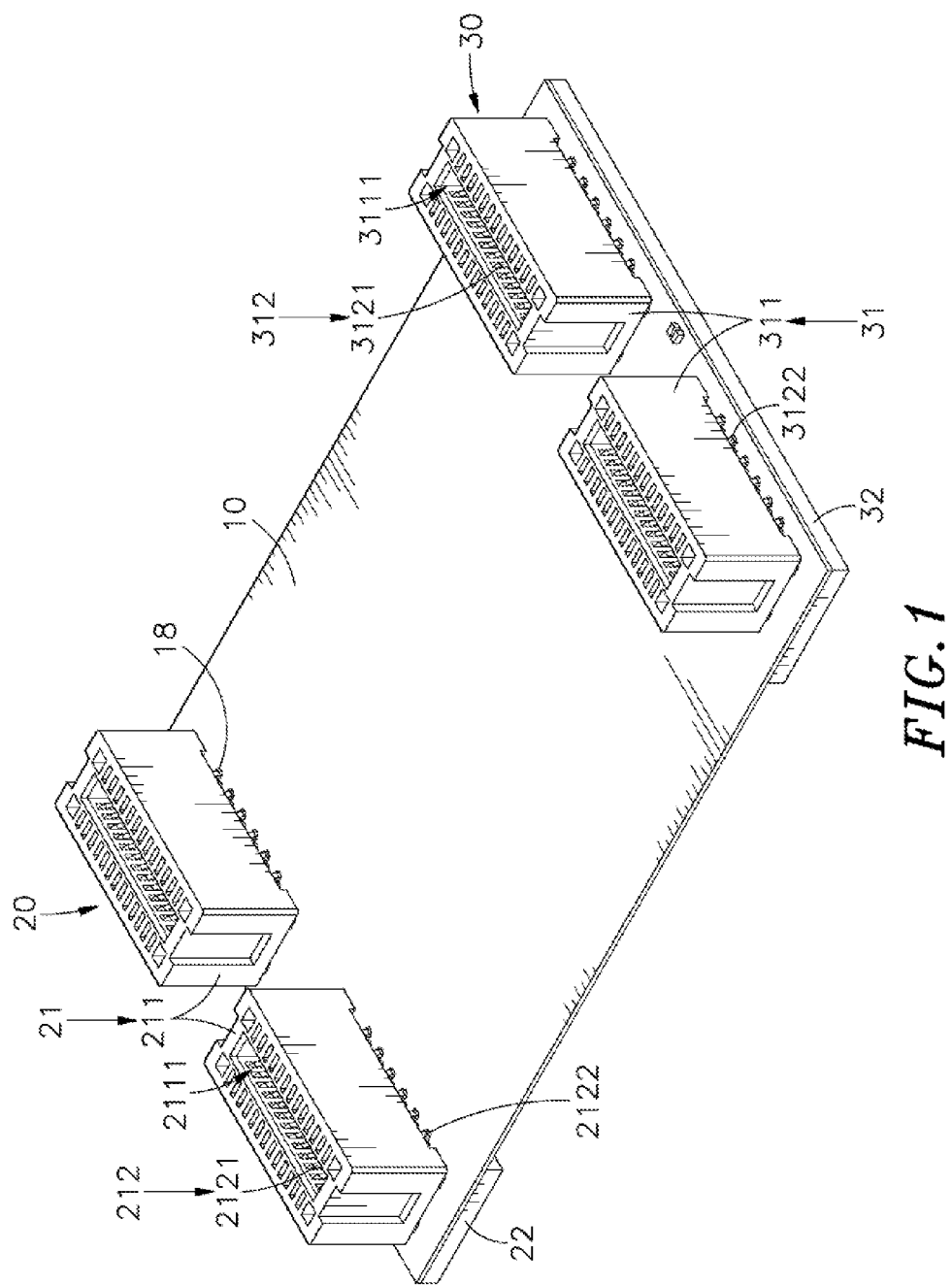
FIG. 1 is an elevational view of a dual-channel flexible circuit bridge connector of the present disclosure.
Figure 2:
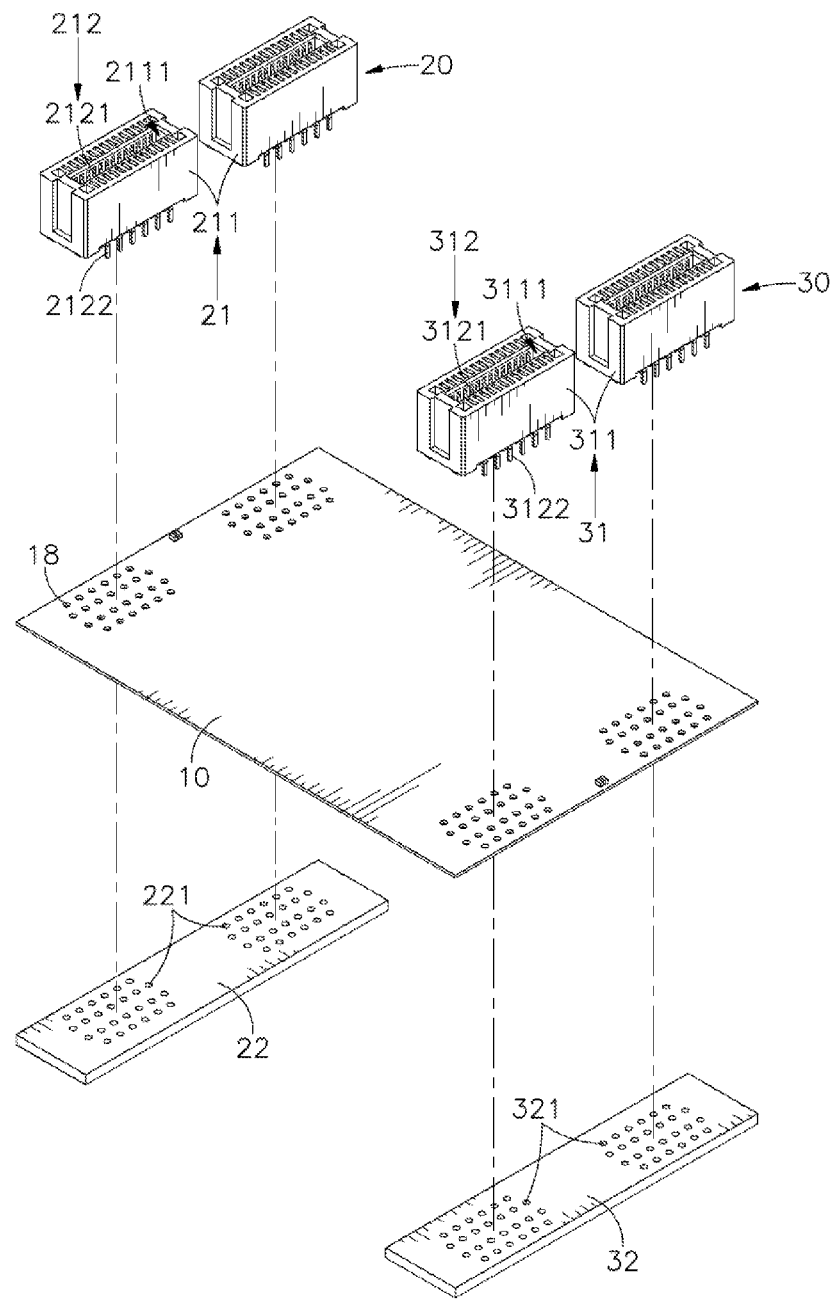
FIG. 2 is an exploded view of the dual-channel flexible circuit bridge connector of the present disclosure.
Figure 3:
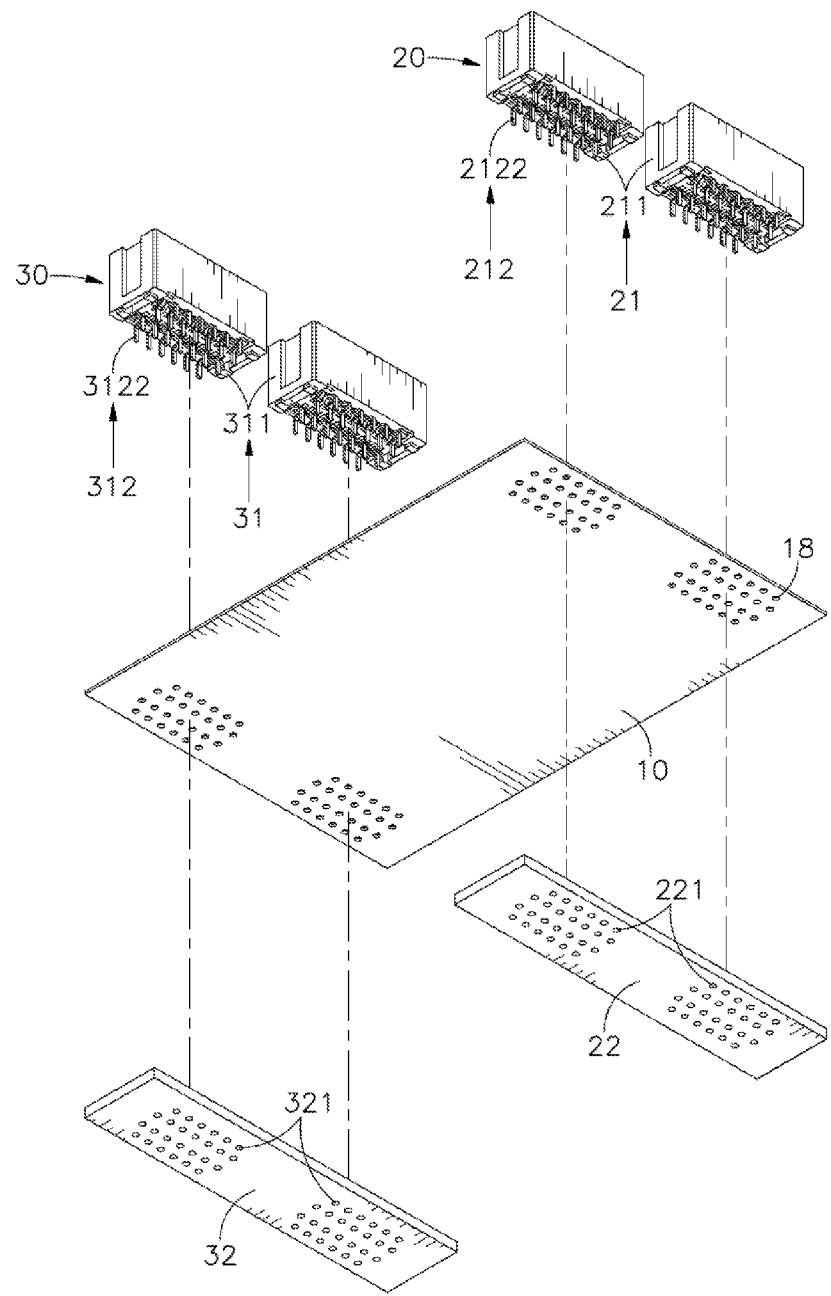
FIG. 3 is an exploded view of the dual-channel flexible circuit bridge connector of the present disclosure, when viewed from another angle.

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present invention. As used herein, the term "or" includes any and all combinations of one or more of the associated listed items.

Please refer to FIGS. 1 through 5, which respectively are elevational view, exploded view, and another exploded view of the dual-channel flexible circuit bridge connector of the present disclosure, and a schematic structural view of the dual-channel flexible circuit board, and a schematic structural view of the dual-channel flexible circuit board of a preferred embodiment of the present disclosure. The dual-channel flexible circuit bridge connector of the present disclosure includes a dual-channel flexible circuit board 10, and a first connection interface 20 and a second connection interface 30 which both are disposed at two sides on the same surface of the dual-channel flexible circuit board 10 and electrically connected with each other.

The dual-channel flexible circuit board 10 includes, in a sequential order from bottom to top, a first insulating layer 11, a first circuit layer 12, a second insulating layer 13, a ground layer 14, a third insulating layer 15, a second circuit layer 16 and a fourth insulating layer 17. The first insulating layer 11 includes a first film 111, a first adhesive layer 112 disposed on an upper surface of the first film 111 to form a capping film. The first circuit layer 12 includes a first conductor 121 which is combined on the first film 111 by the first adhesive layer 112. The second insulating layer 13 includes a second film 131, a second adhesive layer 132 which is disposed on a lower surface of a second film 131 to combine the second film 131 and the first conductor 121, and a third adhesive layer 133 disposed on an upper surface of the second film 131. The ground layer 14 is disposed between the first circuit layer 12 and the second circuit layer 16, and includes a metal conductor 141 combined on the second film 131 by the third adhesive layer 133. The third insulating layer 15 includes a third film 151, a fourth adhesive layer 152 disposed on a lower surface of the third film 151 to combine the third film 151 with the metal conductor 141, and a fifth adhesive layer 153 disposed on an upper surface of the third film 151. The second circuit layer 16 includes a second conductor 161 which is combined on the third film 151 by the fifth adhesive layer 153. The fourth insulating layer 17 includes a fourth film 171, and a sixth adhesive layer 172 disposed on a lower surface of the fourth film 171 to form another capping film. The fourth film 171 is combined on the second conductor 161 by the sixth adhesive layer 172 to form a flexible multilayer board.

The first adhesive layer 112 of the first insulating layer 11, the second adhesive layer 132 and the third adhesive layer 133 of the second insulating layer 13, the fourth adhesive layer 152 and the fifth adhesive layer 153 of the third insulating layer 15, and the sixth adhesive layer 172 of the fourth insulating layer 17 may be epoxy resin, polyester resin, acrylic resin, or other thermoset glue. The first conductor 121 of the first circuit layer 12 and the second conductor 161 of the second circuit layer 16 can be made of rolled copper foil or electrolytic copper foil, and can be performed manufacturing process, such as etching process, to form desired circuits. The ground layer 14 is disposed between the first circuit layer 12 and the second circuit layer 16, and the metal conductor 141 of the ground layer 14 may include copper, aluminum, or silver; and preferably copper foil. The ground layer 14 can be served as a common reference plane or a ground plane (with a reference voltage of 0V) for dual-channel signal transmission on the first circuit layer 12 and the second circuit layer 16.

In this embodiment, the dual-channel flexible circuit board 10 not only includes the first insulating layer 11, the first circuit layer 12, the second insulating layer 13, the ground layer 14, the third insulating layer 15, the second circuit layer 16 and the fourth insulating layer 17, but also includes a first flexible substrate 101, a second flexible substrate 102 and a third flexible substrate 103. The first flexible substrate 101 can be a 3-Layer Flex Copper Clad Laminates (FCCL) formed by the first film 111 of the first insulating layer 11, the first adhesive layer 112, and the first conductor 121 of the first circuit layer 12, and the manufacturing process (such as etching process) is performed on the first flexible substrate 101 to form the desired circuits; similarly, the second flexible substrate 102 can be a 3-Layer FCCL formed by the second film 131 of the second insulating layer 13, the third adhesive layer 133, and the metal conductor 141 of the ground layer 14, and the third flexible substrate 103 can be a 3-Layer FCCL formed by the fourth film 171 of the fourth insulating layer 17, the sixth adhesive layer 172, and the second conductor 161 of the second circuit layer 16. A thickness of the dual-channel flexible circuit board 10, or a sum of thicknesses of the first flexible substrate 101, the second flexible substrate 102 and the third flexible substrate 103 can be in a range of 0.2 mm to 0.6 mm. The dual-channel flexible circuit board 10 includes a plurality of through holes 18 respectively formed on two sides of the dual-channel flexible circuit board 10, and the through holes 18 at the same side of the dual-channel flexible circuit board 10 are separated into two groups. Each through hole 18 is electrically connected to the first circuit layer 12, the ground layer 14 and the second circuit layer 16, so as to achieve interlayer interconnection in the multilayer structure.

Figure 4:
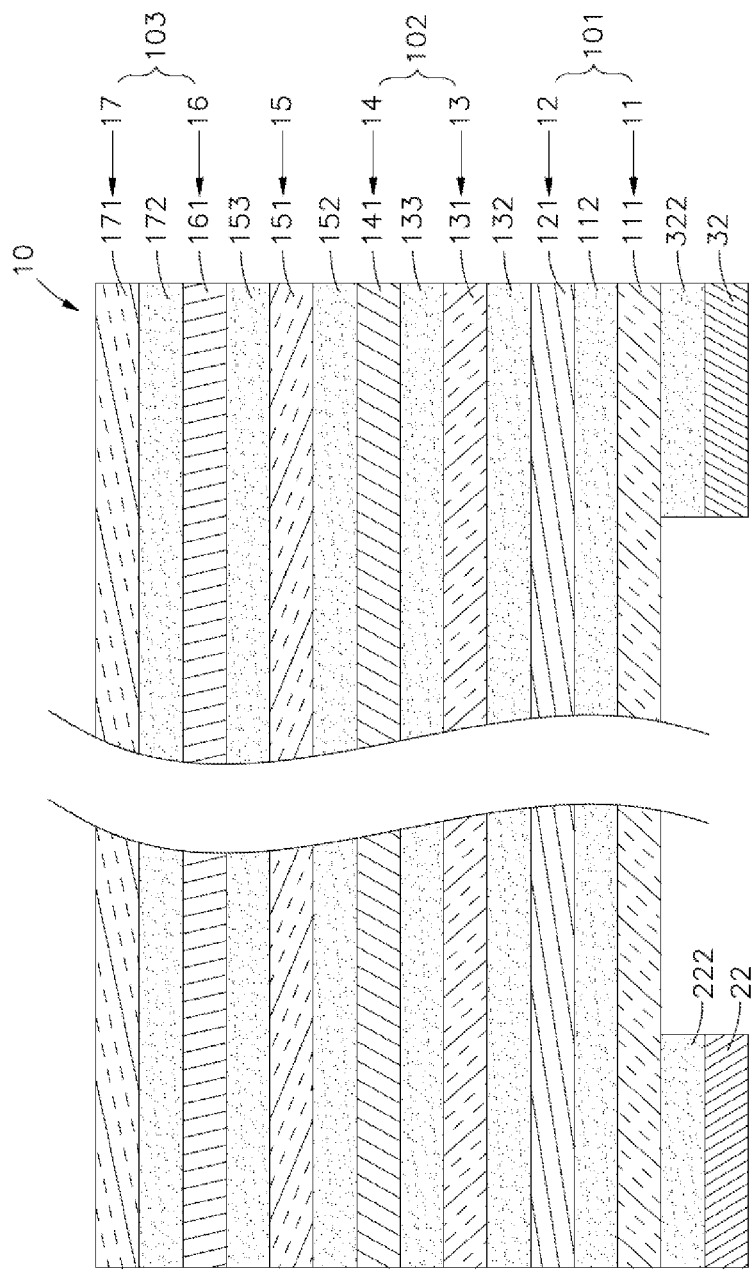
FIG. 4 is a schematic structural view of the dual-channel flexible circuit board of the present disclosure.

The first connection interface 20 includes at least two first bridges 21 which each includes a first socket 211, and each first socket 211 includes a first terminal set 212 which includes a plurality of butt joint parts 2121 respectively inserted into two opposite sidewalls of an insert slot 2111 inside the first socket 211, and each of the butt joint parts 2121 includes a solder part 2122 inserted downwardly through a side of the insert slot 2111 opposite to upper opening of the insert slot 2111 and exposed out of a bottom of the first socket 211. The solder parts 2122 exposed out of the bottom of the first socket 211 are in misaligned arrangement. As a result, a board type or dual in-line package (DIP) type of the first bridge 21 is assembled. A first reinforcing plate 22 having a plurality of insertion holes 221 can be disposed under the first socket 211 of the first bridge 21, and the insertion holes 221 respectively correspond in position to the solder parts 2122 under the first terminal set 212. The first reinforcing plate 22 includes an adhesive layer 222 disposed on a side surface thereof, as shown in FIG. 4.

The second connection interface 30 includes at least two second bridges 31 which each includes a second socket 311, and each second bridge 31 includes a second terminal set 312 which includes a plurality of butt joint parts 3121 respectively inserted into two opposite sidewalls of an insert slot 3111 inside the second socket 311, and each of the butt joint parts 3121 includes a solder part 3122 inserted downwardly through a side of the insert slot 3111 opposite to an upper opening of the insert slot 3111 and exposed out of a bottom of the second socket 311. The solder parts 3122 exposed out of the bottom of the second socket 311 are in misaligned arrangement. As a result, a board type or dual in-line package (DIP) type of the second bridge 31 is assembled. A second reinforcing plate 32 having a plurality of insertion holes 321 is disposed under the second socket 311 of the second bridge 31, and the insertion holes 321 respectively correspond in position to the solder parts 3122 under the second terminal set 312. The second reinforcing plate 32 includes an adhesive layer 322 disposed on a side surface thereof, as shown in FIG. 4.

The first reinforcing plate 22 of the first connection interface 20 and the second reinforcing plate 32 of the second connection interface 30 can be made of glass fiberboard with flame resistant material grade FR4, steel plate, polypropylene (PP), or polyethylene terephthalate (PET). The adhesive layer 222 and the adhesive layer 322 respectively coated or attached on the first reinforcing plate 22 and the second reinforcing plate 32 can be made of adhesive paper or pressure-sensitive adhesive, such as double-sided adhesive paper, hot-melt adhesive, epoxy resin, polyester resin, and acrylic resin.

In order to assemble the ultra-thin dual-channel flexible circuit bridge connector of the present disclosure, the dual-channel flexible circuit board 10 is cut to form a specific shape and desired length. It should be noted that the dual-channel flexible circuit board 10 has been processed by, for example, inner-layer manufacturing process, copper foil etching process for forming circuits, laminating process, or drilling and plating process for forming plated-though-holes. The first bridge 21 of the first connection interface 20 and the second bridge 31 of the second connection interface 30 are respectively disposed at two opposite sides of the same surface of the dual-channel flexible circuit board 10, and the solder parts 2122 of the first terminal set 212 and the solder parts 3122 of the second terminal set 312 are downwardly and vertically inserted into the through holes 18 corresponding thereto at two opposite sides of the dual-channel flexible circuit board 10, respectively. The first sockets 211 and the second sockets 311 are abutted with the same surface of the dual-channel flexible circuit board 10 by bottoms thereof, and the group of the first sockets 211 is spaced apart from the group of the second sockets 311 by a distance in a length direction of the dual-channel flexible circuit board 10, and the first sockets 211 are respectively disposed on left and right sides of the dual-channel flexible circuit board 10, and the second sockets 311 are respectively disposed on left and right sides of the dual-channel flexible circuit board 10. Next, the solder parts 2122 and the solder parts 3122 exposed out of through holes of the dual-channel flexible circuit board 10 are soldered to form electrical connection, so as to effectively prevent the solder structures on the first terminal set 212, the second terminal set 312 and the dual-channel flexible circuit board 10 from being broken or peeled off, thereby making entire structure of the dual-channel flexible circuit bridge connector more stable.

Next, the flux remaining on the soldering areas of the through hole 18 of the dual-channel flexible circuit board 10 are de-flashed, the dual-channel flexible circuit board 10 is glued on other side surface thereof opposite to the first bridge 21 and the second bridge 31, or release films attached on the adhesive layers 222 and 322 of the first reinforcing plate 22 and the second reinforcing plate 32 are torn off, and the insertion holes 221 and 321 are respectively aligned with the solder parts 2122 of the first terminal set 212 and the solder parts 3122 of the second terminal set 312 exposed out of the back surface of the dual-channel flexible circuit board 10; next, the first reinforcing plate 22 and the second reinforcing plate 32 are respectively pressed down to be combined on the back surface of the dual-channel flexible circuit board 10 by the adhesive layers 222 and 322. Each of the insertion holes 221 of the first reinforcing plate 22 and the insertion holes 321 of the second reinforcing plate 32 may have a diameter larger than that of each of the solder parts 2122 of the first terminal set 212 and the solder parts 3122 of the second terminal set 312, so that the first reinforcing plate 22 and the second reinforcing plate 32 can be laminated on the back surface of the dual-channel flexible circuit board 10 more stronger without bubbles, thereby ensuring the adhesive effect between the first reinforcing plate 22, the second reinforcing plate 32 and the dual-channel flexible circuit board 10. As a result, assembly of the dual-channel flexible circuit bridge connector of the present disclosure can be completed.

Figure 5:
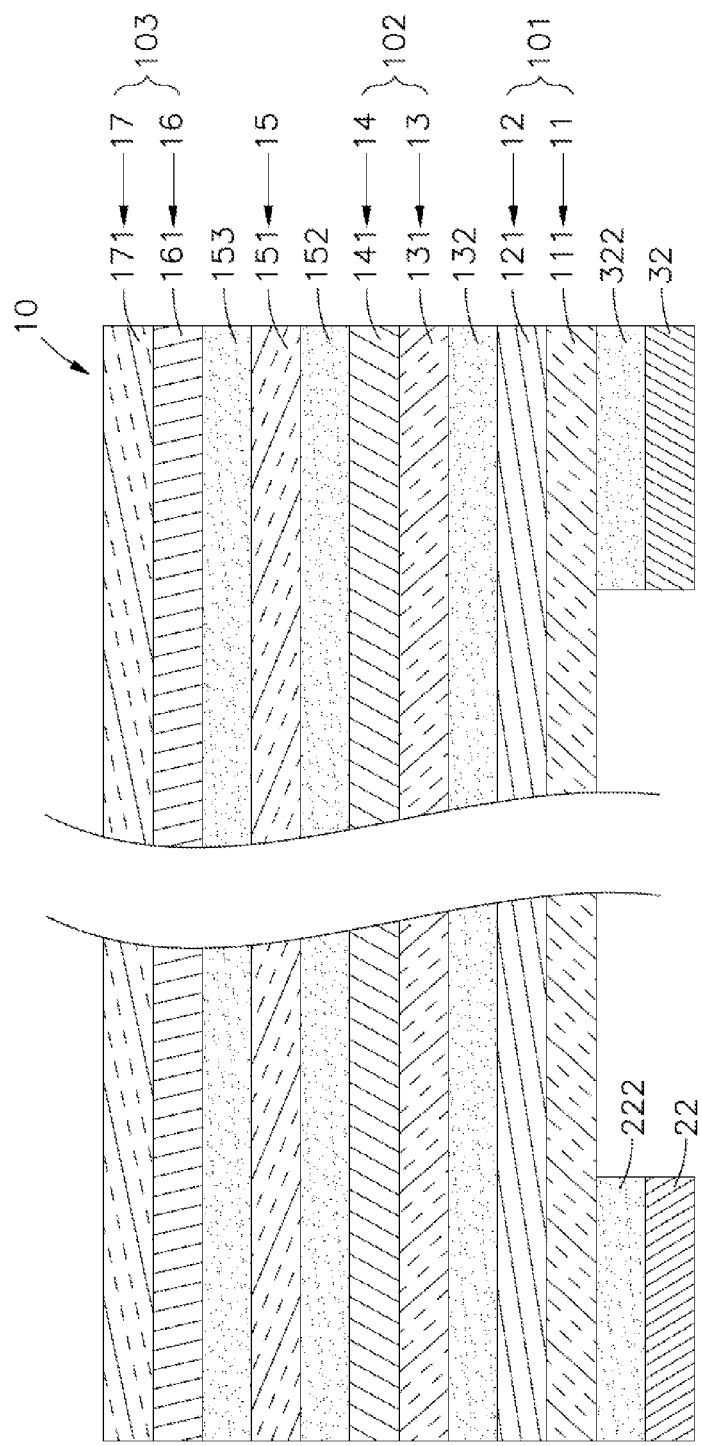
FIG. 5 is a schematic structural view of the dual-channel flexible circuit board of a preferred embodiment of the present disclosure.

The following refers to FIG. 5. The difference between the dual-channel flexible circuit board 10 of the previous embodiment and that of this embodiment shown in FIG. 5 is that there is no first adhesive layer 112 between the first film 111 and the first conductor 121 of the first flexible substrate 101 of this embodiment, and the first conductor 121 of the first circuit layer 12 is directly manufactured on the first film 111 upon different manufacturing process, so as to form a 2-layer FCCL which is then etched to form the desired circuit. However, the actual application of the present disclosure is not limited to this example. In this embodiment, the third adhesive layer 133 between the metal conductor 141 and the second film 131 of the second flexible substrate 102, and the sixth adhesive layer 172 between the fourth film 171 and the second conductor 161 of the third flexible substrate 103 are omitted, and the metal conductor 141 and the second conductor 161 are directly manufactured on the second film 131 and the fourth film 171 respectively to form 2-layer FCCLs. The difference between the 2-Layer FCCL and the 3-Layer FCCL is that, in the 2-Layer FCCL, there is no adhesive layer between inner films and copper foils of the first flexible substrate 101, the second flexible substrate 102 and the third flexible substrate 103, so as to prevent from the inner stress problem and metal thinning problem caused by the adhesive layer, and obtain advantages of higher folding resistance and dimensional stability. Furthermore, when the dual-channel flexible circuit board 10 has fewer layers, the thickness of whole structure of the dual-channel flexible circuit board 10 can be reduced. However, the 2-Layer FCCL has higher cost in manufacturing process, such as coating process, laminating process, or sputtering/plating process; in the other hand, the 3-Layer FCCL is formed by laminating the film and the copper foil through the adhesive layer therebetween, and has an advantage of lower cost than the 2-Layer FCCL. Furthermore, the 3-Layer FCCL can be more suitably manufactured by thicker copper layer. Therefore, the dual-channel flexible circuit board 10 can be manufactured by different processes upon the required thickness and folding resistance of the dual-channel flexible circuit board 10. The following describes the different manufacturing processes.

Figure 6:
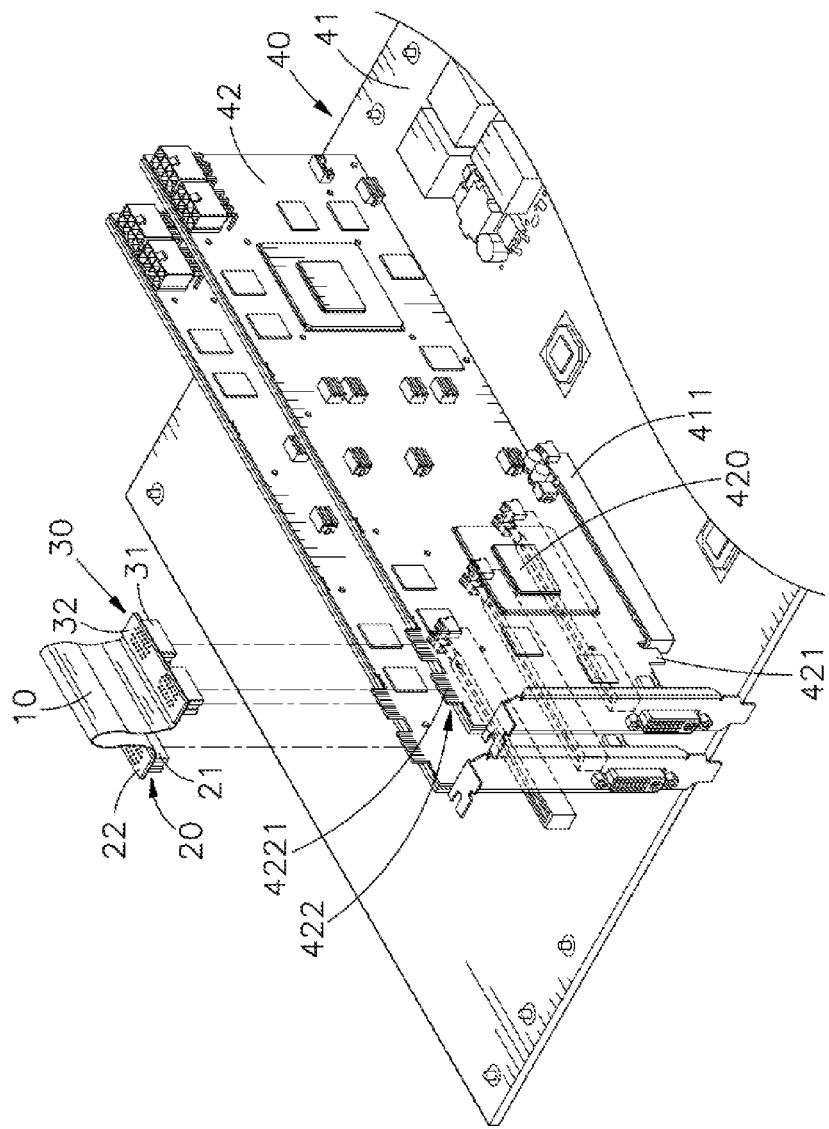
FIG. 6 is an elevational view of a dual graphics card system and other preferred embodiment of the dual-channel flexible circuit bridge connector before connected to other boards, in accordance with the present disclosure.
Figure 7:
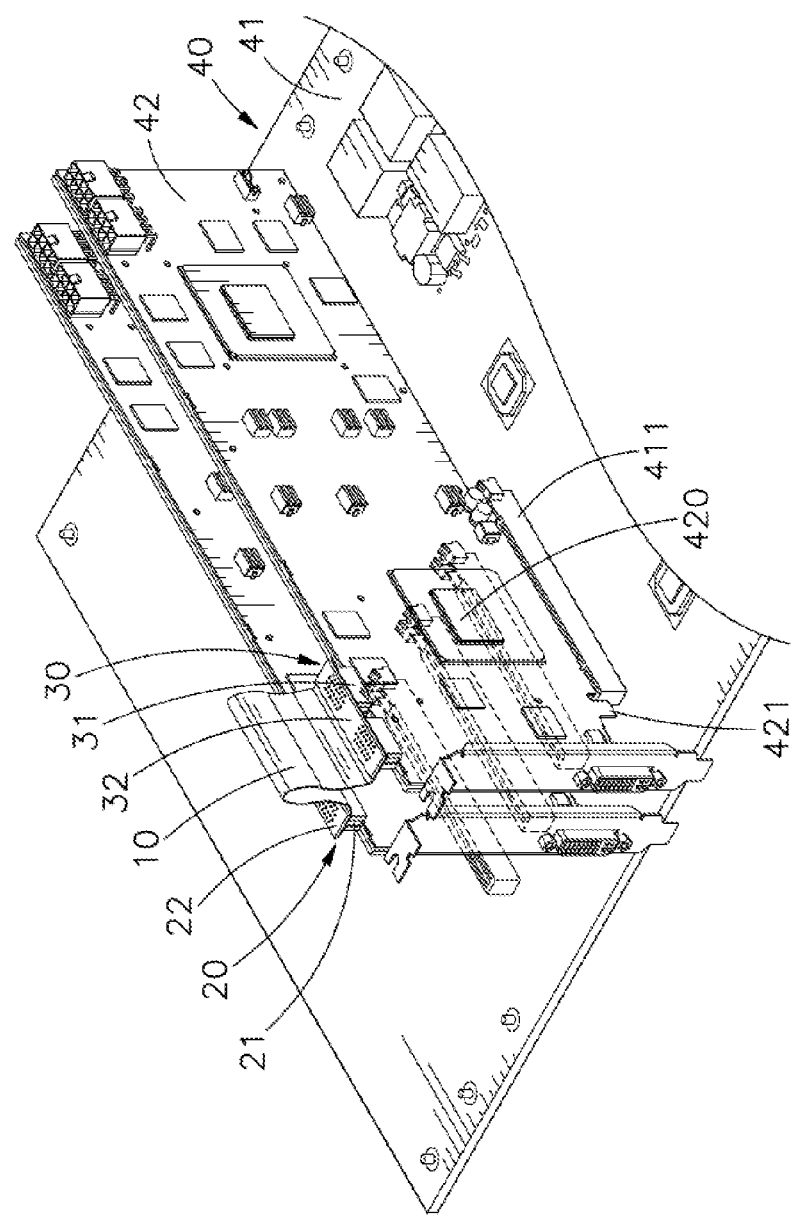
FIG. 7 is an elevational view of the dual graphics card system, and the other preferred embodiment of the ultra-thin dual-channel flexible circuit bridge connector after connected to other boards, in accordance with the present disclosure.
Figure 8:
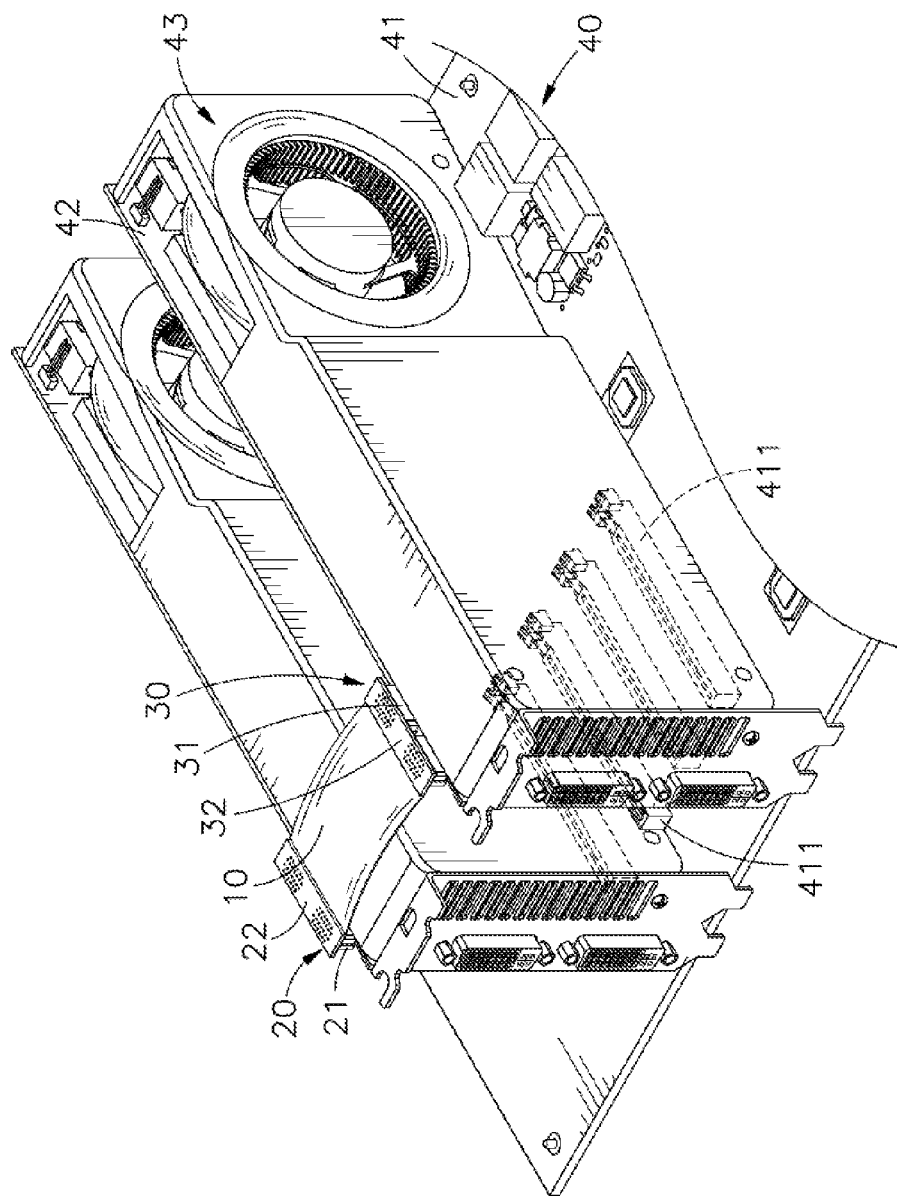
FIG. 8 is an elevational view of the dual graphics card system, and another preferred embodiment of the ultra-thin dual-channel flexible circuit bridge connector of the present disclosure.

Please refer to FIGS. 6 through 8, which are elevational view of a dual graphics card system and other preferred embodiment of the dual-channel flexible circuit bridge connector of the present disclosure before connected with other boards, and elevational view after connected with other boards, and elevational view of the dual graphics card system and another preferred embodiment of the dual-channel flexible circuit bridge connector of the present disclosure. The ultra-thin dual-channel flexible circuit bridge connector of the present disclosure can be applied to a system host 40, such as a desktop computer, a personal computer, an industrial computer, a server or a barebone, but the present disclosure is not limited thereto. The system host 40 includes a motherboard 41 which includes a plurality of PCI-E (Peripheral Component Interconnect Express, PCI Express or PCIe) sockets 411 disposed thereon in parallel, and the at least two PCI-E sockets 411 are inserted with transmission interfaces 421 of graphics cards 42, respectively. Each of the graphics cards 42 can be provided with a chipset 420 including a graphics processing unit (GPU). In this embodiment, the graphics card 42 is supportable to the Scalable Link Interface (SLI) technology. Each of the graphics cards 42 includes two connectors 422 disposed on a top edge and near a side edge thereof, and spaced apart from each other by a distance. Each of the two connectors 422 includes a plurality of metal contacts 4221 respectively disposed on left and right sides thereof. The motherboard 41 in cooperation with the graphics cards 42 can execute computation and graphics acceleration for 3D graphics.

In order to link the two graphics cards 42 on the motherboard 41 by using the dual-channel flexible circuit bridge connector of the present disclosure, as shown in FIG. 6, the dual-channel flexible circuit board 10 shown in FIG. 1 is turned over by 180 degrees to correspond the first connection interface 20 and the second connection interface 30 in position to the two graphics cards 42; next, the first bridge 21 is downwardly connected to the connector 422 on the first graphics card 42 corresponding thereto, to insert the connector 422 into the insert slot 2111 of the first socket 211. The butt joint parts 2121 of the first terminal set 212 are pushed apart subject to the inserting force, so that the connector 422 can be inserted into the insert slot 2111 smoothly. The butt joint parts 2121 of the first terminal set 212 are respectively abutted with and in contact with the metal contacts 4221 corresponding thereto on the connector 422 to form reliable electrical connection therebetween. By similar way, the second sockets 311 of the second bridge 31 can be respectively connected to the connectors 422 of the second graphics card 42, and the butt joint parts 3121 of the second terminal set 312 can be respectively abutted with and in contact with the metal contacts 4221 corresponding thereto on the connector 422 to form electrical connection therebetween. As a result, the first connection interface 20, which includes the two first bridges 21, and the second connection interface 30, which includes the two second bridges 31, disposed on the dual-channel flexible circuit board 10 are respectively connected to the four connectors 422 of the two graphics cards 42, thereby linking the two graphics cards 42 in a dual-channel bridging status. In the dual-channel bridging status, the system host 40 is able to use the chipsets 420 on the two graphics cards 42 to perform parallel computation, so as to improve efficiency of computing process and graphic display.

In this embodiment, under a condition that the first connection interface 20 and the second connection interface 30 disposed on the dual-channel flexible circuit board 10 are used to respectively connect the pair of the first bridges 21 and the pair of the second bridges 31 for linking the two graphics cards 42 in the bridging status, the first circuit layer 12 and the second circuit layer 16 can be used for high-frequency signal transmission in dual-channel, and the ground layer 14 between the first circuit layer 12 and the second circuit layer 16 is served as the common reference plane for high-frequency signal transmission, so that impedance matching can be formed between the first circuit layer 12, the second circuit layer 16 and the ground layer 14, thereby meeting the requirement of characteristic impedance of 50 ohm ($\Omega$) and reducing power loss of skin effect occurred during high frequency signal reflection and transmission. Furthermore, the ground layer 14 can provide shielding and isolating effect for the first circuit layer 12 and the second circuit layer 16, and disposal of these circuit layers close to the common reference plane can reduce EMI and crosstalk interference occurred during high frequency signal transmission. The conventional single-channel flexible bridge connector has a working bandwidth of only 400 MHz and the conventional dual-channel board bridge connector has a working bandwidth of only 680 MHz, and these conventional bridge connectors are unable to meet the requirement for higher working bandwidth; even if these bridge connectors are redesigned for more signal transmission channels and higher working bandwidth, they may have disadvantages of higher thickness and insufficient flexibility. In the other hand, the dual-channel flexible circuit board 10 of the present disclosure can satisfy the requirement for the working bandwidth up to 1360 MHz, and have a total thickness in a range of 0.2 mm to 0.6 mm for nice compactness, and have higher folding resistance; furthermore, the dual-channel flexible circuit board 10 can improve integrity in high frequency signal transmission and also meet the test requirement for characteristic impedance of 50 ohm, thereby achieving stable dual-channel high frequency signal transmission and higher transmission efficiency.

Furthermore, the dual-channel flexible circuit board 10 of the present disclosure has properties of light weight, higher folding resistance and compactness, so the dual-channel flexible circuit board 10 can be upwardly bent as an arch shape, downwardly bent or folded as an acute-angle shape upon demand, and the dual-channel flexible circuit board 10 can be bent or folded by many times without being broken. The pair of the two first bridges 21 of the first connection interface 20 and the pair of the two second bridges 31 of the second connection interface 30 can be used to link the two graphics cards 42 spaced apart by different distances. Therefore, the dual-channel flexible circuit bridge connector of the present disclosure can be applicable to different design solutions of the motherboard 41 or the graphics cards 42 manufactured by various manufacturers without being limited by different bridge distances or insertion space, so as to meet user's requirement in upgrade and expansion.

Please refer to FIG. 8. The difference between previous embodiments and this embodiment is that in the system host 40 of this embodiment, the graphics card 42 includes a cooling device 43 which includes a heat-dissipating module (such as a plurality of heat sinks of a cooler bracket or a heat spreader) attached on a surface of the chipset 420. The heat-dissipating module also includes a fan or a plurality of heat conduction pipes inserted therethrough, and a power wire of the fan can be connected to the graphics card 42, so that the fan can work in cooperation with the heat-dissipating module to dissipate heat of the chipset 420.

In order to quickly dissipate heat generating by the graphics card 42 of the dual graphics card system, the graphics card 42 is usually provided with the cooling device 43, but it may add a size of the graphics card 42 in width direction and two graphics cards 42 are not easily to respectively plug into two adjacent PCI-E sockets 411, and this is the reason that there are usually two empty PCI-E sockets 411 between the two graphics cards 42, and two graphics cards 42 occupy four PCI-E sockets 411. In this architecture, the pair of two bridges 21 of the first connection interface 20 and the pair of two second bridges 31 of the second connection interface 30 of the dual-channel flexible circuit board 10 can be used to link the two graphics cards 42. As a result, the dual-channel flexible circuit bridge connector of the present disclosure is applicable to different specifications of the motherboards 41 and the graphics cards 42, and applicable to the two graphics cards 42 spaced apart by different distances without using different specifications of dual-channel board bridge, so as to prevent problems of high cost and inconvenient storage when the different specifications of dual-channel board bridges are not in use. The dual-channel flexible circuit bridge connector of the present disclosure has high practicability and applicability.

In summary, the first connection interface 20 and the second connection interface 30 are disposed on two opposite sides of the same surface of the dual-channel flexible circuit board 10 of the present disclosure, and the dual-channel flexible circuit board 10 includes, in a sequential order, the first insulating layer 11, the first circuit layer 12, the second insulating layer 13, the ground layer 14, the third insulating layer 15, the second circuit layer 16 and the fourth insulating layer 17; and, the first connection interface 20 includes the first bridges 21 which each includes the first socket 211 and the first terminal set 212, and the second connection interface 30 includes second bridges 31 which each includes the second socket 311 and the second terminal set 312, so that the pair of the first bridges 21 of the first connection interface 20 and the pair of the second bridges 31 of the second connection interface 30 can be used to link the connectors 422 of the two graphics cards 42 spaced apart by different distances to form the bridging status, and the two graphics cards 42 can be operated to perform parallel computation, and the dual graphics card system can have higher efficiency in computing process and graphics display.

The present disclosure disclosed herein has been described by means of specific embodiments. However, numerous modifications, variations and enhancements can be made thereto by those skilled in the art without departing from the spirit and scope of the invention set forth in the claims.

What is claimed is:

1. A dual-channel flexible circuit bridge connector, comprising a dual-channel flexible circuit board, a first connection interface and a second connection interface disposed on two sides on the same surface of the dual-channel flexible circuit board and electrically connected to each other, wherein:

the dual-channel flexible circuit board comprises, in a sequential order, a first insulating layer, a first circuit layer, a second insulating layer, a ground layer, a third insulating layer, a second circuit layer and a fourth insulating layer;

wherein the first connection interface comprises at least two first bridges which each comprises a first socket, and the first socket comprises a first terminal set comprising a plurality of butt joint parts disposed on a side thereof, and the butt joint parts are inserted through an insert slot inside the first socket, and each of the butt joint parts comprises a solder part disposed at an end thereof and inserted through a bottom of the first socket to form electrical connection with the first circuit layer, the ground layer and the second circuit layer, respectively; and wherein the second connection interface comprises at least two second bridges which each comprises a second socket, and the second socket comprises a second terminal set comprising a plurality of butt joint parts disposed on a side thereof, and the butt joint parts are inserted through an insert slot inside the second socket, and each of the butt joint parts comprises a solder part disposed at an end thereof and inserted through a bottom of the second socket to form electrical connection with the first circuit layer, the ground layer and the second circuit layer respectively.

2. The dual-channel flexible circuit bridge connector according to claim 1, wherein the first insulating layer of the dual-channel flexible circuit board comprises a first film, the first circuit layer comprises a first conductor, the second insulating layer comprises a second film, and a second adhesive layer disposed on a lower surface of the second film to combine on the first conductor;

wherein the ground layer comprises metal conductor, and the third insulating layer comprises a third film, a fourth adhesive layer disposed on a lower surface of the third film to combine on the metal conductor, and a fifth adhesive layer disposed on an upper surface thereof;

wherein the second circuit layer comprises a second conductor combined on the third film by the fifth adhesive layer, and the fourth insulating layer comprises a fourth film.

3. The dual-channel flexible circuit bridge connector according to claim 2, wherein the first insulating layer comprises a first adhesive layer disposed on an upper surface of the first film, and the first conductor is combined on the first film by the first adhesive layer;

wherein the second insulating layer comprises a third adhesive layer disposed on an upper surface of the second film, and the metal conductor is combined on the second film by the third adhesive layer;

wherein the fourth insulating layer comprises a sixth adhesive layer disposed on a lower surface of the fourth film, and the fourth film is combined on the second conductor by the sixth adhesive layer.

4. The dual-channel flexible circuit bridge connector according to claim 1, wherein the dual-channel flexible circuit board comprises a plurality of through holes formed on two opposite sides thereof, and each of the through holes is electrically connected to the first circuit layer, the ground layer and the second circuit layer to form interlayer interconnection therebetween, and the first terminal set of the first bridge and the second terminal set of the second bridge are soldered with the through holes through the solder parts by a dual in-line package manner.

5. A dual graphics card system using a dual-channel flexible circuit bridge connector for linking, the dual graphics card system comprising a dual-channel flexible circuit board, a first connection interface, a second connection interface and two graphics cards respectively installed in two sockets disposed in parallel on a motherboard, and each of the two graphics cards comprises two connectors spaced apart from by a distance, wherein:

the dual-channel flexible circuit board comprises, in a sequential order, a first insulating layer, a first circuit layer, a second insulating layer, a ground layer, a third insulating layer, a second circuit layer and a fourth insulating layer;

wherein the first connection interface comprises at least two first bridges which each comprises a first socket, and the first socket comprises an insert slot inserted through by a connector of graphic cards, a first terminal set comprising a plurality of butt joint parts disposed on a side thereof, and the butt joint parts inserted through the insert slot inside the first socket for contacting the connector of the graphics card to form electrical connection, and each of the butt joint parts comprises a solder part disposed at other side thereof and inserted through a bottom of the first socket to form electrical connection with the first circuit layer, the ground layer and the second circuit layer, respectively;

wherein the second connection interface comprises at least two second bridges which each comprises a second socket, and the second socket comprises an insert slot inserted through by a connector of graphic cards, a second terminal set comprising a plurality of butt joint parts disposed on a side thereof, and the butt joint parts inserted through the insert slot inside the second socket for contacting the connector of the graphics card to for electrical connection, and each of the butt joint parts comprises a solder part disposed at other side thereof and inserted through a bottom of the second socket to form electrical connection with the first circuit layer, the ground layer and the second circuit layer respectively;

wherein the first connection interface and the second connection interface are disposed at two opposite sides on the same surface of the dual-channel flexible circuit board and electrically connected with each other, and the first connection interface and the second connection interface are respectively linked with the two graphics card, which are spaced apart by a non-fixed distance, so as to from a bridging status.

6. The dual graphics card system according to claim 5, wherein the first insulating layer of the dual-channel flexible circuit board comprises a first film, the first circuit layer comprises a first conductor, the second insulating layer comprises a second film, and a second adhesive layer disposed on a lower surface of the second film to combine on the first conductor;

wherein the ground layer comprises a metal conductor, and the third insulating layer comprises a third film, a fourth adhesive layer disposed on a lower surface of the third film to combine on the metal conductor, and a fifth adhesive layer disposed on an upper surface thereof;

wherein the second circuit layer comprises a second conductor combined on the third film by the fifth adhesive layer, and the fourth insulating layer comprises a fourth film.

7. The dual graphics card system according to claim 6, wherein the first insulating layer comprises a first adhesive layer disposed on an upper surface of the first film, and the first conductor is combined on the first film by the first adhesive layer, and the second insulating layer comprises a third adhesive layer disposed on an upper surface of the second film, and the metal conductor is combined on the second film by the third adhesive layer;

wherein the fourth insulating layer comprises a sixth adhesive layer disposed on a lower surface of the fourth film, and the fourth film is combined on the second conductor by the sixth adhesive layer.

8. The dual graphics card system according to claim 5, wherein the dual-channel flexible circuit board comprises a plurality of through holes formed on two opposite sides thereof, and each of the through holes is electrically connected to the first circuit layer, the ground layer and the second circuit layer to form interlayer interconnection therebetween, and the first terminal set of the first bridge and the second terminal set of the second bridge are soldered with the through holes through the solder parts by a dual in-line package manner.

* * * * *